United States Patent [19]
Fulford, Jr. et al.

[11] Patent Number: 6,107,130
[45] Date of Patent: Aug. 22, 2000

[54] CMOS INTEGRATED CIRCUIT HAVING A SACRIFICIAL METAL SPACER FOR PRODUCING GRADED NMOS SOURCE/DRAIN JUNCTIONS DISSIMILAR FROM PMOS SOURCE/DRAIN JUNCTIONS

[75] Inventors: H. Jim Fulford, Jr., Austin; Mark I. Gardner, Cedar Creek; Derick J. Wristers, Austin, all of Tex.

[73] Assignee: Advanced Micro Devices, Inc., Sunnyvale, Calif.

[21] Appl. No.: 09/189,235

[22] Filed: Nov. 10, 1998

Related U.S. Application Data

[62] Division of application No. 08/761,399, Dec. 6, 1996, Pat. No. 5,869,879.

[51] Int. Cl.⁷ .................................................. H01L 21/8238
[52] U.S. Cl. ............................................ 438/231; 438/304
[58] Field of Search .................................. 438/229, 230, 438/231, 232, 275, 304, 305, 529

[56] References Cited

U.S. PATENT DOCUMENTS

| | | | |
|---|---|---|---|
| 4,172,260 | 10/1979 | Okabe et al. | 257/409 |
| 4,356,623 | 11/1982 | Hunter . | |
| 4,638,347 | 1/1987 | Iyer . | |
| 4,818,715 | 4/1989 | Chao . | |
| 4,843,023 | 6/1989 | Chiu et al. . | |
| 4,925,807 | 5/1990 | Yoshikawa . | |
| 4,949,136 | 8/1990 | Jain | 257/344 |
| 4,971,922 | 11/1990 | Watabe et al. . | |
| 5,015,598 | 5/1991 | Verhaar | 438/304 |
| 5,023,190 | 6/1991 | Lee et al. | 438/231 |
| 5,091,763 | 2/1992 | Sanchez | 438/304 |
| 5,153,145 | 10/1992 | Lee et al. . | |
| 5,168,072 | 12/1992 | Moslehi . | |
| 5,221,632 | 6/1993 | Kurimoto et al. . | |
| 5,241,203 | 8/1993 | Hsu et al. | 257/344 |
| 5,278,441 | 1/1994 | Kang et al. . | |
| 5,405,791 | 4/1995 | Ahmad et al. . | |
| 5,422,506 | 6/1995 | Zamapian | 257/344 |
| 5,424,234 | 6/1995 | Kwon . | |
| 5,444,282 | 8/1995 | Yamaguchi et al. | 257/344 |
| 5,470,773 | 11/1995 | Liu et al. . | |
| 5,493,130 | 2/1996 | Dennison et al. . | |
| 5,498,555 | 3/1996 | Lin | 438/304 |
| 5,501,997 | 3/1996 | Lin et al. . | |
| 5,512,771 | 4/1996 | Hiroki et al. . | |
| 5,545,578 | 8/1996 | Park et al. . | |
| 5,602,045 | 2/1997 | Kimura . | |
| 5,654,212 | 8/1997 | Jang | 438/304 |
| 5,663,586 | 9/1997 | Lin . | |
| 5,677,224 | 10/1997 | Kadosh et al. . | |

(List continued on next page.)

FOREIGN PATENT DOCUMENTS

| | | |
|---|---|---|
| 2-280342 | 11/1990 | Japan . |
| 4-208571 | 7/1992 | Japan . |
| 5-267327 | 10/1993 | Japan . |

OTHER PUBLICATIONS

Wolf et al., *Silicon Processing for the VLSI Era—vol. 1: Process Technology*, Lattice Press, CA 1986, p. 183.
Wolf, "Silicon Processing for the VLSI Era", vol. 1, pp. 321–323, 1986.

*Primary Examiner*—Chandra Chaudhari
*Attorney, Agent, or Firm*—Kevin L. Daffer; Conly, Rose & Tayon

[57] ABSTRACT

An integrated circuit is formed whereby junction of NMOS transistors are formed dissimilar to junctions of PMOS transistors. The NMOS transistors include an LDD area, an MDD area and a heavy concentration source/drain area. Conversely, the PMOS transistor include an LDD area and a source/drain area. The NMOS transistor junction is formed dissimilar from the PMOS transistor junction to take into account the less mobile nature of the junction dopants relative to the PMOS dopants. Thus, a lessening of the LDD area and the inclusion of an MDD area provide lower source/drain resistance and higher ohmic connectivity in the NMOS device. The PMOS junction includes a relatively large LDD area so as to draw the highly mobile, heavy concentration boron atoms away from the PMOS channel.

20 Claims, 5 Drawing Sheets

U.S. PATENT DOCUMENTS

| | | |
|---|---|---|
| 5,710,450 | 1/1998 | Chau et al. . |
| 5,719,425 | 2/1998 | Akram et al. . |
| 5,739,573 | 4/1998 | Kawaguchi . |
| 5,747,373 | 5/1998 | Yu . |
| 5,757,045 | 5/1998 | Tsai et al. . |
| 5,766,969 | 6/1998 | Fulford, Jr. et al. . |
| 5,776,825 | 7/1998 | Suganaga et al. . |
| 5,783,475 | 7/1998 | Ramaswami . |
| 5,793,089 | 8/1998 | Fulford, Jr. et al. . |
| 5,837,572 | 11/1998 | Gardner et al. . |
| 5,846,857 | 12/1998 | Ju . |
| 5,869,866 | 2/1999 | Fulford, Jr. et al. . |
| 5,869,879 | 2/1999 | Fulford, Jr. et al. . |
| 5,882,973 | 3/1999 | Gardner et al. . |

FIG. 14

CMOS INTEGRATED CIRCUIT HAVING A SACRIFICIAL METAL SPACER FOR PRODUCING GRADED NMOS SOURCE/DRAIN JUNCTIONS DISSIMILAR FROM PMOS SOURCE/DRAIN JUNCTIONS

This is a Division of application Ser. No. 08/761,399, filed Dec. 6, 1996 now U.S. Pat. No. 5,869,879.

BACKGROUND OF THE INVENTION

1. Field of the Invention

This invention relates to semiconductor fabrication and, more particularly, to an integrated circuit having a dissimilarly placed graded junction produced by the selective formation or removal of a metal spacer.

2. Description of Relevant Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well recognized LOCOS technique.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal anneal ("RTA") chamber. A gate conductor material is then deposited across the entire dielectric-covered substrate. The gate conductor material is preferably polycrystalline silicon, or polysilicon. The polysilicon layer is then patterned using a photolithography mask. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

An n-channel transistor, or NMOS transistor, must in most instances be fabricated different from a p-channel transistor, or PMOS transistor. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and the distance between junction regions is typically referred to as the physical channel length. After implantation and subsequent diffusion of the junction regions, the distance between the junction regions become less than the physical channel length and is often referred to as the effective channel length ("Leff"). In high density designs, not only does the physical channel length become small so too must the Leff. As Leff decreases below approximately 1.0 $\mu$m, for example, a problem known as short channel effects ("SCE") becomes predominant.

A problem related to SCE, and the subthreshold currents associated therewith, but altogether different is the problem of hot-carrier effects ("HCE"). HCE is a phenomenon by which hot-carriers ("holes and electrons") arrive at or near an electric field gradient. The electric field gradient, often referred to as the maximum electric field ("Em"), occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 $\mu$m.

Unless modifications are made to the fabrication sequence, problems resulting from HCE will remain. To minimize these problems, a mechanism must be derived that disperses and thereby reduces Em. That mechanism is often referred to as the double-diffused drain ("DDD") and lightly doped drain ("LDD") techniques. The purpose behind using DDDs and LDDs structures is to absorb some of the potential into the drain and away from the drain/channel interface. The popularity of DDD structures has given way to LDD structures since DDD may cause unacceptably deep junctions and deleterious junction capacitance.

A conventional LDD structure is one whereby a light concentration of dopant is self-aligned to the edge of the gate conductor. The light-dopant concentration is then followed by a heavier-dopant concentration which is self-aligned to a spacer formed on the sidewalls of the gate conductor. The purpose of the first implant dose is to produce a lightly doped section of both the source and drain junction areas at the gate edge near the channel. The second implant dose is spaced from the channel a distance dictated by the thickness of the sidewall spacer. Resulting from the first and second implants, a dopant gradient occurs across the junction from the source/drain area of the junction to the LDD area adjacent the channel.

The dopant gradient across the junction, henceforth referred to as a graded junction, is necessary for several reasons. First, the lightly doped region (LDD area) is used to assume a substantial portion of the entire voltage drop associated with Em. It has been reported that the LDD area may in some instances reduce Em at the drain juncture by approximately 30–40%. Secondly, the heavier dosage within the source/drain area forms a low resistivity region suitable for enhanced contact conductivity. Further, the source/drain dose is implanted at a higher energy necessary to produce deeper source/drain junctions and thereby provide better protection against junction spiking.

The benefits of using an LDD area in conjunction with a source/drain area is generally well documented. However, the benefits differ depending upon whether an NMOS device or a PMOS device is produced. For example, an NMOS device requires an LDD area more so than a PMOS device. However, an unduly large LDD area would dampen NMOS performance by increasing the source-drain resistance. On the other hand, the dopants used to form a PMOS device (i.e., boron) are more mobile than the dopants used to form an NMOS device. As such, the p-type dopants regularly segregate and migrate from their original implant position toward and into the channel area. This lessens Leff and produces deleterious SCE problems.

It would therefore be desirable to employ a CMOS fabrication process which can produce NMOS junctions dissimilar from PMOS junctions. If the NMOS junction is graded such that the LDD area is relatively small, then performance can be enhanced. Similarly, if the PMOS junction can be graded such that the highly mobile source/drain implants are drawn farther from the channel then SCE can be more carefully controlled.

SUMMARY OF THE INVENTION

The problems outlined above are in large part solved by an improved fabrication process hereof. The process can be used to form both PMOS and NMOS transistors having dissimilar junction configurations. The NMOS transistor includes an LDD area, a medium doped drain (MDD) area and a source/drain area. The LDD serves to absorb and thereby lessen Em and the problems of HCE. The MDD serves not only to lessen Em but also to enhance contact conductivity and source-drain responsiveness. The PMOS transistor is formed along with the NMOS transistor in accordance with the present CMOS process. The PMOS transistor includes a source/drain area drawn away from the PMOS channel. The source/drain of the PMOS device includes highly mobile boron atoms which, when drawn from the channel, have a lessened opportunity to migrate into the channel and thereby change the designed transistor operation.

The benefits of having dissimilar graded junctions are realized by employing two different types of spacers on sidewall surfaces of the NMOS and PMOS gate conductors. Preferably, a conductive spacer is configured upon the outer surface of a dielectric spacer. However, it is appreciated that the roles may be reversed such that a dielectric spacer is configured on the outer surface of a conductive spacer. According to one embodiment, the dielectric spacer comprises silicon nitride or polycrystalline silicon. However, the dielectric spacer may also comprise chemical vapor deposited (CVD) oxide. The conductive spacer preferably comprises a metal, a suitable metal being tungsten, titanium and/or aluminum.

Of prime importance is the selectivity by which the conductive spacer can be removed relative to the dielectric spacer, or vice versa. As such, the present CMOS process can be implemented either by placing the LDD area before the source/drain area or the source/drain area before the LDD area.

In the instance where the source/drain areas are formed after the LDD areas, the following examples are used to illustrate PMOS and NMOS fabrication sequences. For a PMOS device, the LDD areas are implanted, followed by formation of both the dielectric and conductive spacers in sequence, followed by implanting the source/drain areas. For an NMOS device, the LDD areas are implanted, followed by formation of the dielectric spacer, implantation of the MDD area, followed by formation of the conductive spacer, followed by implantation of the source/drain areas.

In the instance where the LDD area is formed after the source/drain area, the following examples apply. In the formation of a PMOS device, the source/drain area is implanted first, followed by removal of both the conductive and dielectric spacers, followed by implantation in the LDD area. Formation of an NMOS device involves implanting the source/drain areas, followed by removal of the conductive spacer, followed by implanting the MDD areas, followed by removing the dielectric spacer and then implanting the LDD areas.

Broadly speaking, the present invention contemplates an integrated circuit having possibly numerous transistors. Each transistor comprises a gate conductor dielectrically spaced over the semiconductor substrate. The gate conductor has opposed sidewall surfaces on which a dielectric spacer is configured. Extending laterally from the dielectric spacer is a conductive spacer.

The integrated circuit comprises a CMOS integrated circuit. The CMOS circuit includes both NMOS and PMOS transistors. The NMOS transistor is formed by implanting a first implant species into the semiconductor substrate using the gate conductor as a mask. After the dielectric spacer is formed, the dielectric spacer and gate conductor in combination are used to mask a second implant species (i.e., MDD implant) forwarded into the semiconductor substrate. After the conductive spacer is formed, the conductive spacer, dielectric spacer and gate conductor serve to mask a third implant species (i.e., source/drain implant) forwarded into the semiconductor substrate. The NMOS transistor includes a graded junction having implant species of increasing concentration and implant energies forwarded in succession as first, second and third implants drawn increasing distances from the channel region.

A PMOS transistor is formed similar to the NMOS transistor, except that a second implant species is not forwarded into the semiconductor substrate. Instead, only a first and third implant species are used. Depending on whether an NMOS or a PMOS device is formed, the first, second (if applicable) and third implant species are either n-type or p-type, respectively.

The present invention contemplates formation of spacers additively upon each other, and the successive formation of implant areas of increasing concentration extending laterally from the channel area. Conversely, the integrated circuit can be formed by successively removing spacers from one another and forming implant areas in succession toward the channel area. In the former instance, the source/drain regions are formed after the LDD area or the LDD and MDD area. In the latter instance, the source/drain regions are formed before the LDD area, or before the LDD and MDD areas.

The conductive spacer may therefore be a sacrificial spacer. More specifically, the conductive spacer can be removed during the layer-by-layer removal of spacers and the formation of LDD (or MDD) areas after the source/drain areas. In the additive process, the conductive spacer is preferably removed during silicide formation. That is, the conductive spacer may be removed at the same time in which the refractory metal used in forming the silicide is removed.

Regardless of whether the additive process or subtractive process is used, the objective remains the same: to produce an NMOS graded junction dissimilar from a PMOS graded junction. Of benefit is the formation of the NMOS and PMOS junctions in a CMOS process.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
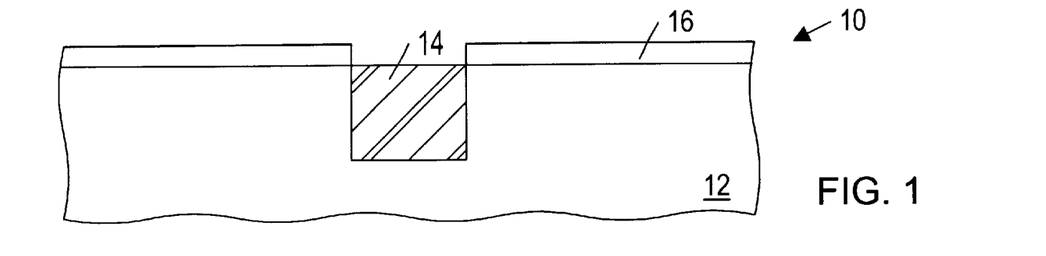
FIG. 1 is a partial cross-sectional view of a semiconductor topography showing a gate dielectric formed upon active areas of the topography.

Turning now to the drawings, FIG. 1 illustrates a partial cross-sectional view of a semiconductor topography 10. Topography 10 includes a semiconductor substrate 12 into which or upon which various isolation structures 14 are formed. Isolation structures 14 can be formed using either the shallow trench process, or the LOCOS process. In the embodiment shown, a shallow trench process is illustrated as an exemplary isolation structure. Isolation structure 14 comprises a dielectric which does not readily allow gate dielectric formation. Instead, a gate dielectric 16 is formed in regions absent structure 14. Gate dielectric 16 is preferably formed according to a thermal oxidation process upon and within the silicon-based substrate 12. The thickness of the grown oxide depends upon the processing parameters desired, and the overall performance of the ensuing transistor.

Figure 2:
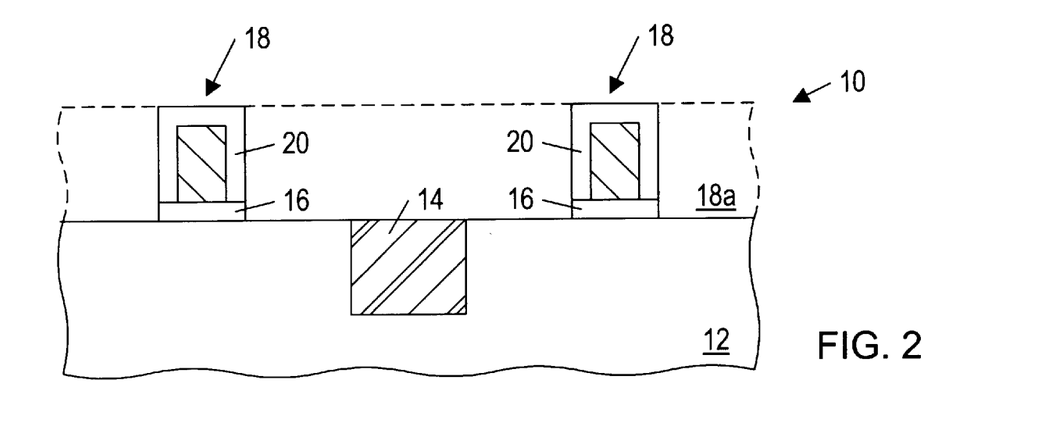
FIG. 2 is a partial cross-sectional view of the semiconductor topography according to a processing step subsequent to FIG. 1, wherein gate conductors are formed having sidewall oxides.

Referring to FIG. 2, gate conductors 18 are patterned from a layer of material 18a. According to a preferred embodiment, material 18a comprises a layer of polycrystalline silicon. The polycrystalline silicon ("polysilicon") is selectively removed using well-known lithography procedures. The remaining portions of the polysilicon layer form gate conductors 18. Each gate conductor thereby comprises polysilicon patterned upon gate dielectric 16, and the combination of gate conductor 18 and gate dielectric 16 exist in select regions, defined as active regions of semiconductor topography 10. Active regions are those regions which exist between isolation structures 14. Preferably, gate conductor 18 includes a polysilicon oxide 20. Polysilicon oxide 20 exists on the upper and sidewall surfaces of gate conductor 18, and is grown according to well-known thermal oxidation procedures.

Figure 3:
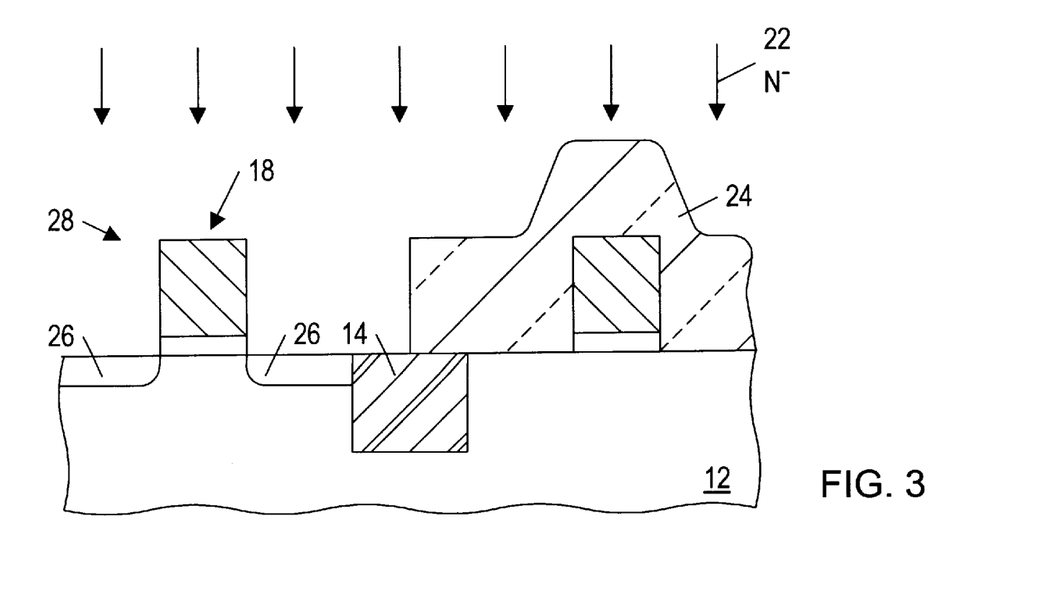
FIG. 3 is a partial cross-sectional view of the semiconductor topography according to a processing step subsequent to FIG. 2, wherein an n-type LDD implant is forwarded into the semiconductor substrate.

According to the well-known self-aligned process, implant areas are formed within substrate 12 on opposites sides of a gate conductor as shown in FIG. 3. More specifically, an n-type implant referred to as an LDD implant 22 is forwarded using the gate conductor as a mask. The portion of the substrate which receives n-type LDD implant 22 is the active area of an NMOS transistor region. The active area of the PMOS transistor is covered by a masking material 24. A suitable masking material includes a spin-on material such as photoresist. FIG. 3 thereby illustrates an LDD area 26 formed in the active region of an NMOS transistor 28. The LDD implant 22 and the ensuing LDD area 26 are defined as having a relatively low concentration of n-type dopants, suitable dopants preferably comprising phosphorous ions in the concentration of, for example, $1 \times 10^{13}$ to $1 \times 10^{14}$ atoms/cm$^2$. The depth at which the LDD implant is placed, according to one example, is in the range of approximately 0.1 microns. Alternatively, arsenic may be used as the n-type LDD implant, suitably forwarded into substrate 12 at a dose of $2 \times 10^{14}$ atoms/cm$^2$, for example.

Figure 4:
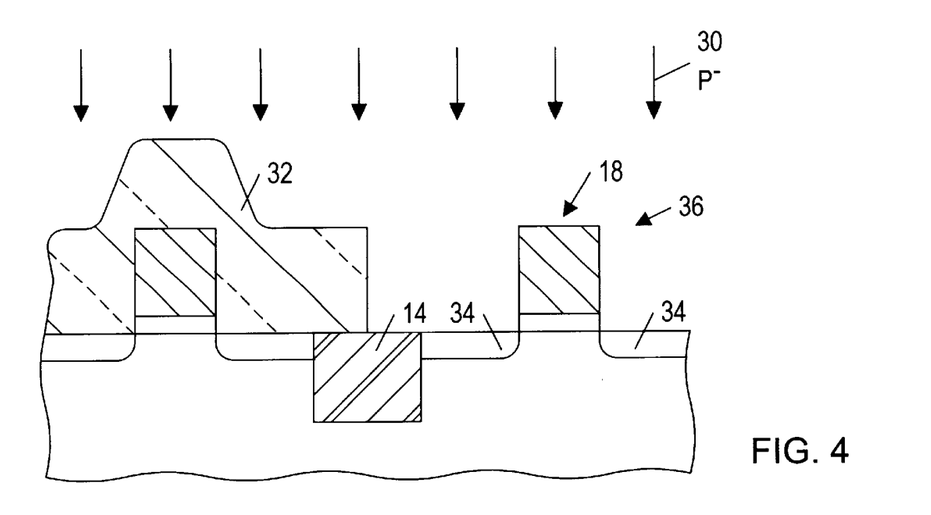
FIG. 4 is a partial cross-sectional view of the semiconductor topography according to a processing step subsequent to FIG. 3, wherein a p-type LDD implant is forwarded into the semiconductor substrate.

Turning to FIG. 4, p-type LDD implantation 30 is shown. The p-type LDD implant 30 is masked by (or self-aligned with) the exposed gate conductor 18, masking material 32 and isolation structure 14. As a result of the implant process, LDD areas 34 are produced in the active regions of a PMOS transistor 36.

Implant of p-type LDD implant 30 can vary, similar to the n-type LDD implant 22. The amount of variability depends upon the performance desired. Accordingly, the concentration and implant energies of the LDD implant 30 can vary according to parameters known to those skilled in the art. Preferably, LDD implant 30 comprises boron.

Figure 5:
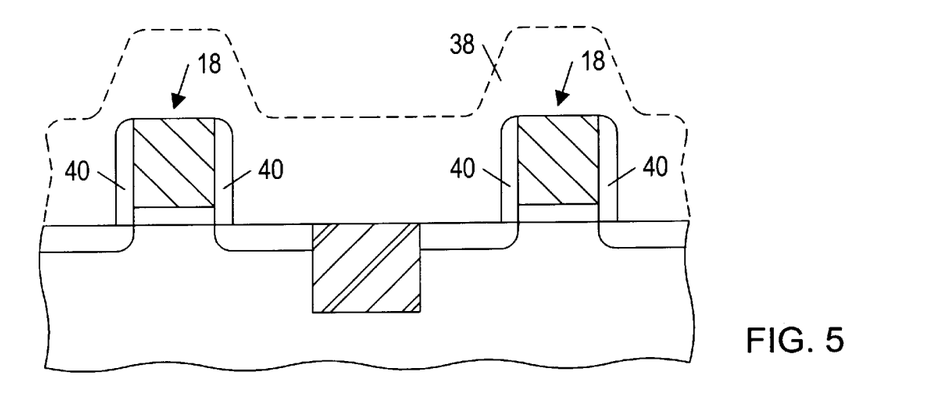
FIG. 5 is a partial cross-sectional view of the semiconductor topography according to a processing step subsequent to FIG. 4, wherein a dielectric spacer is formed on the oxide-covered sidewall surfaces of the gate conductors.

FIG. 5 illustrates deposition of a spacer material 38, followed by partial removal of spacer material 38. Spacer material 38 comprises a dielectric substance, according to one embodiment. The dielectric is removed from substantially horizontal surfaces at a faster rate than removal from substantially vertical surfaces. This removal process is often referred to as an "anisotropic" etch process. The etch duration is terminated, however, before the entirety of material 38 is removed. Accordingly, anisotropic etch duration is chosen to remove material from horizontal surfaces while retaining some material on vertical surfaces. Retainage occurs primarily on the sidewall surfaces of gate conductor 18. The retained portion is henceforth referred to as a dielectric spacer 40.

Figure 6:
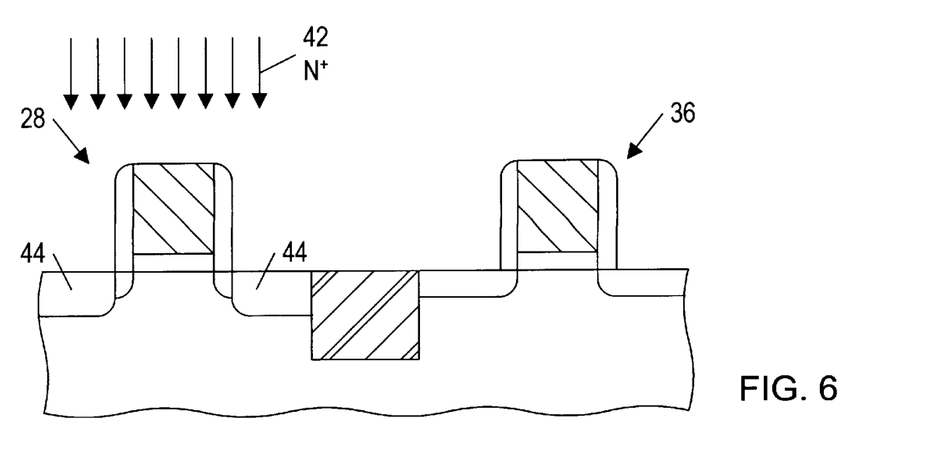
FIG. 6 is a partial cross-sectional view of the semiconductor topography according to a processing step subsequent to FIG. 5, wherein an n-type MDD implant is forwarded into the semiconductor substrate.

Material 38 is preferably chemical vapor deposited ("CVD") using numerous well-known techniques. Deposition thickness is varied to account for a desired thickness which would preferably equal if not exceed the thickness of gate conductor 18. Once material 38 is removed from horizontal surfaces to form spacers 40, those spacers serve to mask, in combination with gate conductor 18, subsequent implant species. FIG. 6 illustrates the masking of an n-type MDD implant 42. MDD implant 42 can be of the same species as LDD implant 22; however, MDD implant 42 is implanted at a heavier concentration and at greater energies than LDD implant 22. Accordingly, MDD implant 42 forms MDD area 44. Although not shown, a masking material covers PMOS transistor area 36 so that implant 42 occurs only in the active regions of NMOS transistor 28. The masking material, and the steps used in patterning the masking material are not shown for sake of brevity. However, it is understood that the steps needed to selectively place MDD implant 42 are similar to those used in selectively placing LDD implant 22 (shown in FIG. 3).

Figure 7:
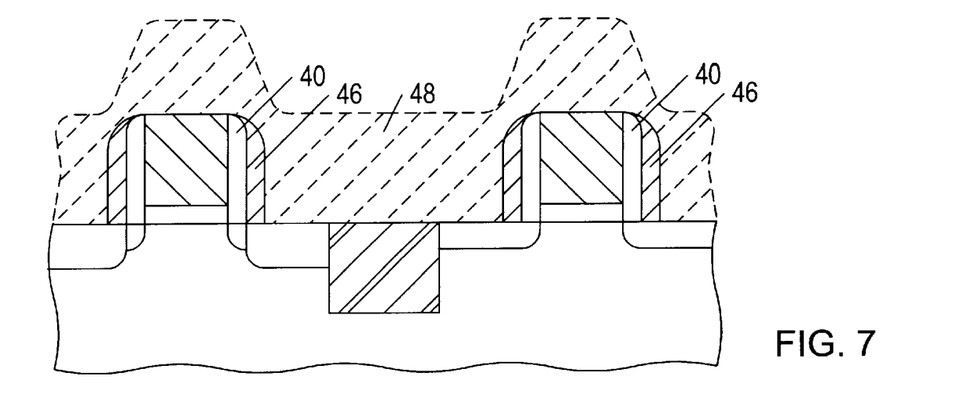
FIG. 7 is a partial cross-sectional view of the semiconductor topography according to a processing step subsequent to FIG. 6, wherein a conductive spacer is formed on the dielectric spacer.

FIG. 7 depicts the formation of a conductive spacer 46 from a layer of conductive material 48. Conductive spacer 46 is produced by first depositing a layer of conductive material 48. The conductive material is one that has substantial electrical conduction properties, more so than material 38 shown in FIG. 5. A suitable conductive material comprises metal, such as aluminum, titanium and/or tungsten. After deposition, material 48 is anisotropically removed, similar to the way in which material 38 is removed in that an anisotropic etch is used albeit with a different chemical composition. The anisotropic etch is defined as a plasma or "dry" etch having both chemical and mechanical (ion-assisted) removal agents. After removal of material 48, that which is retained exists primarily on vertical surfaces adjacent dielectric spacer 40.

Figure 8:
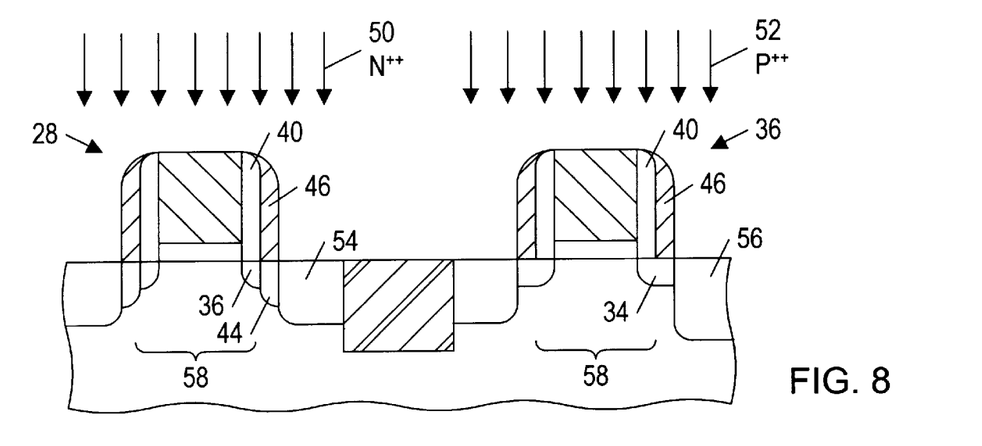
FIG. 8 is a partial cross-sectional view of the semiconductor topography according to processing steps subsequent to FIG. 7, wherein n-type and p-type source/drain implants are forwarded into respective portions of the semiconductor substrate.

FIG. 8 depicts the purpose behind having both a dielectric spacer 40 and a conductive spacer 46 arranged on sidewall surfaces of gate conductors which form both PMOS and NMOS transistors 36 and 28 respectively. Using the dual spacers and the gate conductors as a mask, heavy concentration source/drain implants are forwarded into respective active areas. The n-type source/drain implant 50 is forwarded into active areas of NMOS transistor 28, while p-type source/drain implants 52 are forwarded into active areas of PMOS transistor 36. The n-type source/drain implants 50 are forwarded at a heavier concentration than MDD implant 42 and LDD implant 22 to form source/drain area 54. Likewise, source/drain implant 52 is implanted at a heavier concentration and at a greater energy level than LDD implant 30 to form source/drain area 56. Importantly, source/drain area 56 is drawn from channel area 58 such that a greater LDD area 34 exists relative to LDD area 36. The drawing of source/drain area 56 further from channel 58 allows for more migration of highly mobile atoms arising from area 56. Typically, boron is used as the source/drain implant 52 and, since boron is highly mobile, it is beneficial to define the source/drain area 56 away from channel 58 so that boron migration does not deleteriously affect transistor 36 operation.

While the junction area, i.e., the active area defined between the channel and the isolation region, is graded for PMOS transistor 36, it is even further graded for NMOS transistor 28. PMOS transistor 36 includes source/drain in LDD regions within the graded junction, whereas NMOS transistor 28 junctions include source/drain area 54, MDD area 44 and LDD area 36. Primarily due to the less mobile nature of the MDD implant 42, MDD area 44 need not be drawn away from channel 58, similar to the way in which source/drain regions are drawn. By utilizing an MDD area, a lessening of LDD area 36 exists. Accordingly, NMOS transistor 28 can achieve higher performance/speed arising from less parasitic resistance in the source-drain path.

Figure 9:
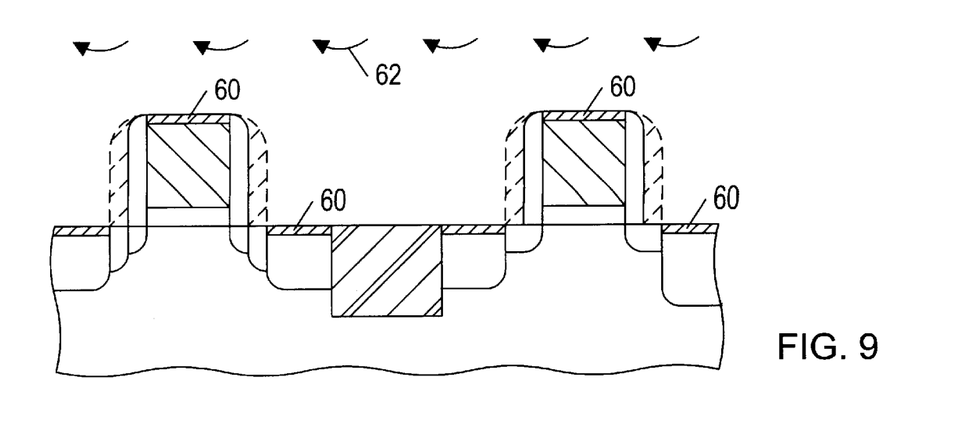
FIG. 9 is a partial cross-sectional view of the semiconductor topography according to a processing step subsequent to FIG. 8, wherein a silicide is formed after the conductive spacer is removed to conclude formation of PMOS and NMOS junctions according to a processing sequence of FIGS. 1–9.

FIG. 9 depicts removal of conductive spacer 46 and formation of silicide 60. Silicide 60 forms on exposed silicon regions. To form a silicide, a refractory metal is deposited across the entire exposed surfaces. The metal undergoes a two-step anneal process. The first anneal cycle causes a first phase reaction. All non-reacted metal is removed except in regions where silicon atoms are prevalent. Thus, the second anneal step causes a second phase reaction of refractory metal only on silicon-based junctions and the upper surface of the polysilicon gate conductor 18. Silicide 60 serves to enhance conductivity of subsequent metalization layers drawn to the junctions. For sake of brevity and clarity of the drawings, subsequent metalization layers are not shown. However, it is to be understood that an integrated circuit which utilizes the present process will have subsequent fabrication steps involving interlevel dielectrics and one or more layers of metalization.

Conductive spacer 46 can be removed using various techniques. According to one technique, spacer 46 is removed at the same time in which the refractory metal used in forming the silicide is removed. Accordingly, the removal step shown in FIG. 9, and depicted as reference numeral 62, occurs after the first phase of silicide is formed, but before the second phase occurs. Alternatively, conductive spacer 46 may be removed after both the first and second phases are completed. In either instance, removal is preferably a wet etch process generally done in heated solutions of phosphoric acid, nitric acid, acetic acid and water, for example. Alternatively, the wet etch can be a CAROS solution, or an RCA solution containing peroxide and amonium chloride, for example. A benefit in removing conductive spacer 46 after silicide formation is to ensure silicide 60 extends only across the most highly conductive implant area (i.e., source/drain implant areas 54 and 56).

Figure 10:
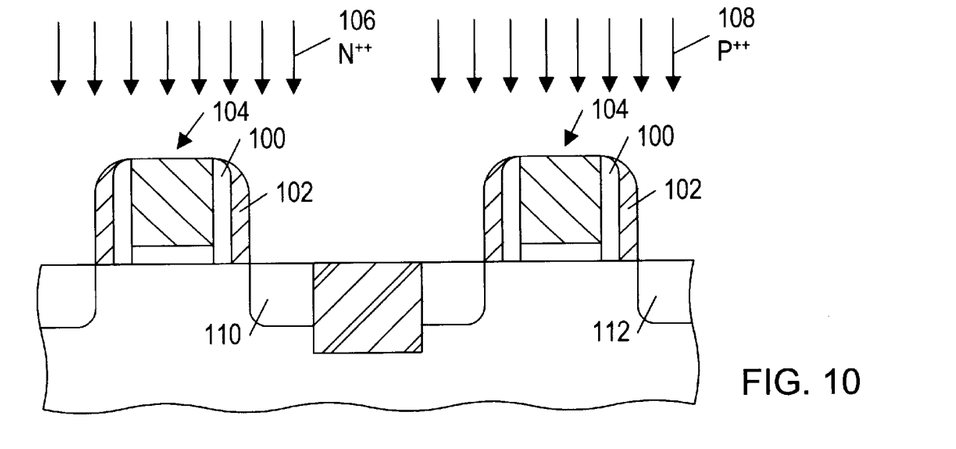
FIG. 10 is a partial cross-sectional view of a semiconductor topography showing pre-existing, layered dielectric and conductive spacers used to mask n-type and p-type source/drain implants forwarded into the semiconductor substrate.
Figure 14:
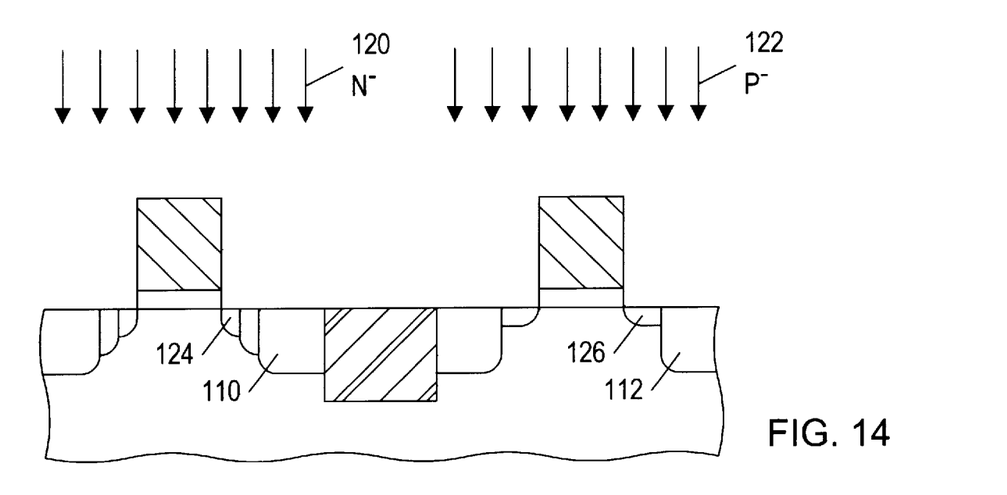
FIG. 14 is a partial cross-sectional view of the semiconductor topography according to processing steps subsequent to FIG. 13, wherein n-type and p-type source/drain implants are forwarded into respective portions of the semiconductor substrate to conclude formation of PMOS and NMOS junctions according to the processing sequence of FIGS. 10–14.

Referring to FIG. 10, an alternative processing sequence is shown, culminating the steps shown in FIG. 14. Instead of additively placing spacers, and interspersing implants between the addition of spacers, the embodiment shown in FIGS. 10–14 describes subtractive (or removal of spacers and the implantation which occurs after removal). FIG. 10 depicts the pre-existing, layered spacers 100 and 102. Spacer 102 may be conductive, while spacer 100 is a dielectric. Alternatively, spacer 102 may be a dielectric and spacer 100 a conductor. In either instance, both spacers, in conjunction with gate conductors 104 form a mask for heavy concentration source/drain implants 106 and 108. Implant 106 is shown as an n-type source/drain implant forwarded into active regions of an NMOS transistor, whereas implants 108 are shown as p-type source/drain implants and forwarded into PMOS transistor areas. The ensuing source/drain areas of the NMOS transistor are shown as reference numeral 110, and the source/drain areas of the PMOS transistor are shown as reference numeral 112.

Figure 11:
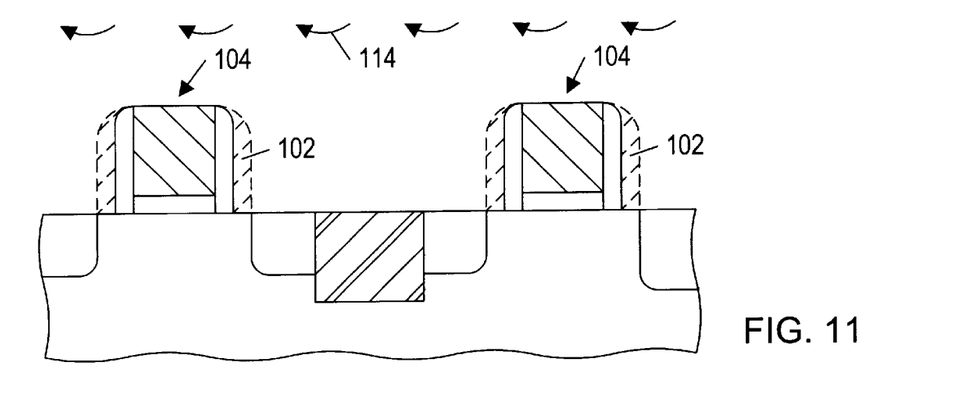
FIG. 11 is a partial cross-sectional view of the semiconductor topography according to a processing step subsequent to FIG. 10, wherein the conductive spacers are removed.
Figure 12:
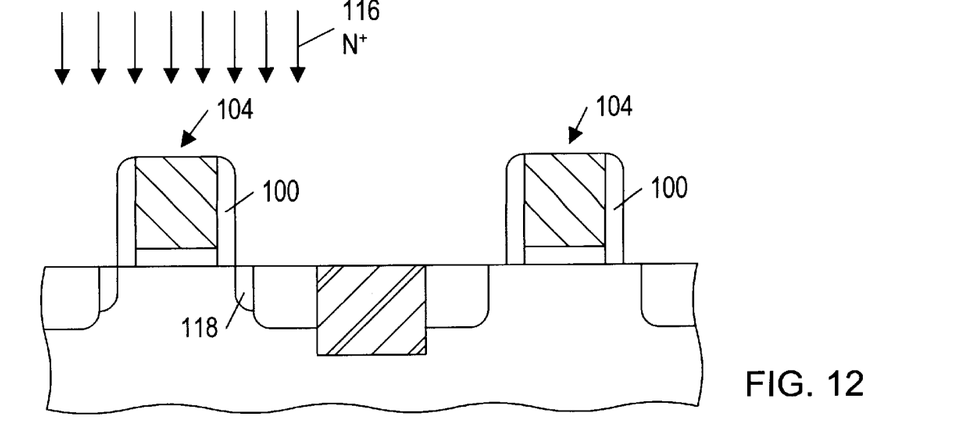
FIG. 12 is a partial cross-sectional view of the semiconductor topography according to a processing step subsequent to FIG. 11, wherein an n-type MDD implant is forwarded into the semiconductor substrate.

FIG. 11 illustrates removal 114 of conductive spacer 102 preferably using the same etch species described in reference to FIG. 9. Thereafter, as shown in FIG. 12, MDD implants 116 are forwarded into the NMOS transistor area to form MDD implant areas 118. Gate conductor 104 and spacer 100 serve to mask MDD implant 116.

Figure 13:
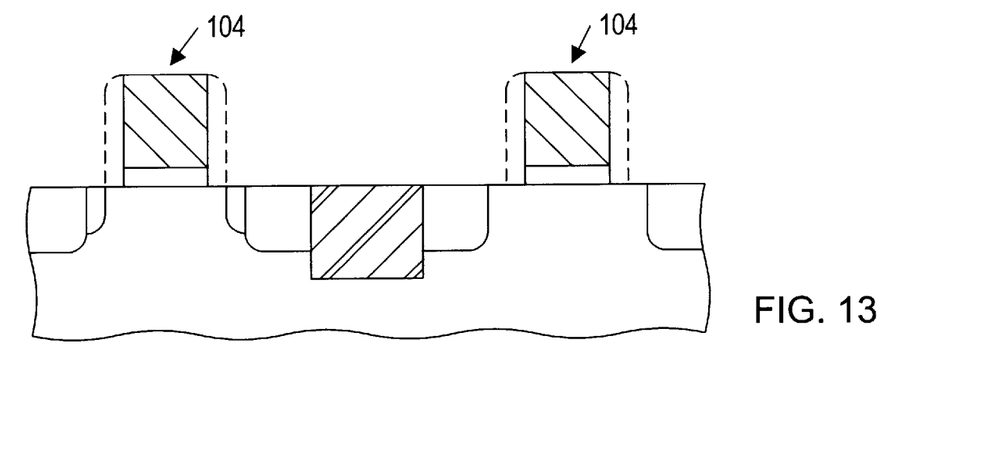
FIG. 13 is a partial cross-sectional view of the semiconductor topography according to a processing step subsequent to FIG. 12, wherein the dielectric spacers are removed.

FIG. 13 depicts removal of dielectric spacer 100 using preferably a wet etch solution. If dielectric spacer 110 comprises oxide, then the oxide may be removed using hydrofluoric acid, possibly buffered with deionized water. What is left, after wet etch removal, are sidewall surfaces of gate conductor 104. The sidewall surfaces serve to self-align LDD implants 120 and 122, shown in FIG. 14. The LDD implants can be forwarded in succession to produce LDD implant areas 124 and 126 in the NMOS and PMOS active areas, respectively. Similar to the embodiment shown in FIGS. 1–9, LDD implant area 126 is made purposely larger than LDD implant area 124. The added spacing is need to compensate for the higher mobility of boron atoms relative to phosphorous or arsenic. Understood, but not shown, is a subsequent silicide formation step used in making contact to the higher concentration regions within both the NMOS and PMOS junctions. During silicide formation, an oxide spacer may be formed on the sidewall surfaces of the gate conductor, wherein the oxide spacer is dimensioned with a thickness that extends out to the inside edge of source/drain areas 110 and 112. The oxide spacer (not shown) is thereby used to prevent silicide bridging as well as to direct (or self-align) the silicide to the heavy concentration source/drain areas 110 and 112.

It will be appreciated to those skilled in the art having the benefit of this disclosure that this invention is believed to be capable of forming MOS transistor junctions which are graded not only to minimize HCE problems, but also to enhance operation and ohmic connectivity thereto. It is to be understood that the form of the invention shown and described is to be taken as exemplary, presently preferred embodiments. Various modifications and changes may be made to each and every processing step without departing from the spirit and scope of the invention given the benefit of this disclosure as set forth in the claims. It is intended that the following claims be interpreted to embrace all such modifications and changes and, accordingly, the specification and drawings are to be regarded in an illustrative rather than a restrictive sense.

What is claimed is:

1. A method for forming a CMOS integrated circuit, comprising:

patterning a first gate conductor between opposing sidewall surfaces across a first channel portion of a semiconductor topography;

using the first gate conductor as a mask, implanting a first n-type dopant into said semiconductor topography adjacent said channel portion;

forming a dielectric spacer upon the sidewall surfaces;

using the dielectric spacer and the first gate conductor as a mask, implanting a second n-type dopant into said semiconductor topography a first spaced distance from said channel portion;

forming a conductive spacer upon the dielectric spacer; and using the conductive spacer, the dielectric spacer and the first gate conductor as a mask, implanting a third n-type dopant into said semiconductor topography a second spaced distance greater than the first spaced distance from said channel portion.

2. The method as recited in claim 1, wherein said first n-type dopant is implanted at a lesser concentration and at a lesser energy into said semiconductor substrate than said second n-type dopant, and wherein said second n-type dopant is forwarded at a lesser concentration and at a lesser energy into said semiconductor substrate than said third n-type dopant.

3. The method as recited in claim 1, wherein said first n-type dopant comprises phosphorous, and wherein said second and third n-type dopant comprises arsenic.

4. The method as recited in claim 1, wherein forming said conductive spacer comprises depositing a metal layer upon the dielectric spacer and anisotropically removing the metal layer except immediately adjacent said dielectric spacer.

5. The method as recited in claim 1, further comprising:

patterning a second gate conductor across a second channel portion of the semiconductor topography a lateral spaced distance from the first gate conductor, wherein the second gate conductor comprises opposing second sidewall surface between which the second gate conductor is confined;

using the second gate conductors as a mask, implanting a first p-type dopant into said semiconductor topography adjacent said second channel portion;

forming the dielectric spacer and the conductive spacer upon the second sidewall surfaces; and using the conductive spacer, the dielectric spacer and the second gate conductor as a mask, implanting a second p-type dopant into said semiconductor topography a first spaced distance from said second channel portion.

6. The method as recited in claim 5, wherein said first p-type dopant is implanted at a lesser concentration and at a lesser energy into said semiconductor substrate than said second p-type dopant.

7. A method for forming an integrated circuit, comprising:

patterning a first gate conductor having opposed sidewall surfaces across a first channel portion of a dielectric covered semiconductor substrate;

forming a dielectric spacer upon the sidewall surfaces and a conductive spacer upon the dielectric spacer;

using the conductive spacer, the dielectric spacer and the gate conductor as a mask, implanting into said semiconductor substrate n-type dopants at a first concentration;

using the dielectric spacer as an etch stop, removing the conductive spacer;

using the dielectric spacer and the gate conductor as a mask, implanting into said semiconductor substrate n-type dopants at a second concentration less than the first concentration;

using the gate conductor as an etch stop, removing the dielectric spacer; and using the gate conductor as a mask, implanting into said semiconductor substrate n-type dopants at a third concentration less than the second concentration.

8. The method as recited in claim 7, wherein said sidewall surfaces comprise thermally oxidized polycrystalline silicon.

9. The method as recited in claim 7, wherein said conductive spacer comprises metal.

10. The method as recited in claim 7, further comprising forming silicide upon and into said semiconductor substrate.

11. The method as recited in claim 1, further comprising removing the conductive spacer subsequent to said implanting a third n-type dopant.

12. The method as recited in claim 1, wherein said sidewall surfaces comprise thermally oxidized polycrystalline silicon.

13. The method as recited in claim 1, wherein said conductive spacer comprises metal selected from the group consisting of tungsten, titanium and aluminum.

14. The method as recited in claim 1, further comprising forming silicide upon and into said semiconductor topography.

15. The method as recited in claim 5, wherein an as-implanted p-type lightly doped drain region formed by said implanting a first p-type dopant and a second p-type dopant has a greater lateral width than an as-implanted n-type lightly doped drain region formed by said implanting a first n-type dopant and a second n-type dopant.

16. The method as recited in claim 7, farther comprising:

patterning a second gate conductor having opposed sidewall surfaces a lateral spaced distance from the first gate conductor across a second channel portion of the semiconductor substrate;

forming a dielectric spacer upon the sidewall surfaces and a conductive spacer upon the dielectric spacer;

using the conductive spacer, the dielectric spacer and the second gate conductor as a mask, implanting into said semiconductor substrate p-type dopants at a first concentration;

using the dielectric spacer as an etch stop, removing the conductive spacer;

using the second gate conductor as an etch stop, removing the dielectric spacer; and using the second gate conductor as a mask, implanting into said semiconductor substrate p-type dopants at a second concentration less than the first concentration.

17. The method as recited in claim 10, further comprising removing the conductive spacer either during formation of the silicide or by using a wet etch process.

18. The method as recited in claim 7, wherein said first and second n-type dopant comprises phosphorous, and wherein said third n-type dopant comprises arsenic.

19. The method as recited in claim 7, wherein forming said conductive spacer comprises depositing a metal layer upon the dielectric spacer and anisotropically removing the metal layer except immediately adjacent said dielectric spacer.

20. The method as recited in claim 7, wherein an as-implanted p-type lightly doped drain region formed by said implanting a first p-type dopant and a second p-type dopant has a greater lateral width that an as-implanted n-type lightly doped drain region formed by said implanting a second n-type dopant and a third n-type dopant.

* * * * *